US012772420B2

(12) United States Patent
Spinazzola et al.

(10) Patent No.: US 12,772,420 B2
(45) Date of Patent: Oct. 20, 2026

(54) HYBRID DRY ADIABATIC COOLING CHILLED WATER PLANT FOR DATA CENTERS AND OTHER IT ENVIRONMENTS

(71) Applicant: Shumate Engineering, PLLC, Tysons, VA (US)

(72) Inventors: Robert Stephen Spinazzola, Lewes, DE (US); Justin Neal Penrod, Fairfax, VA (US)

(73) Assignee: SHUMATE ENGINEERING, PLLC, Tysons, VA (US)

( * ) Notice: Subject to any disclaimer, the term of this patent is extended or adjusted under 35 U.S.C. 154(b) by 0 days.

(21) Appl. No.: 19/301,855

(22) Filed: Aug. 15, 2025

(65) Prior Publication Data

US 2025/0380388 A1 Dec. 11, 2025

Related U.S. Application Data

(62) Division of application No. 18/949,183, filed on Nov. 15, 2024, now Pat. No. 12,426,214.

(Continued)

(51) Int. Cl.
*H05K 7/20* (2006.01)

(52) U.S. Cl.
CPC ..... *H05K 7/20809* (2013.01); *H05K 7/20309* (2013.01); *H05K 7/20318* (2013.01); (Continued)

(58) Field of Classification Search
CPC ........... H05K 7/20809; H05K 7/20309; H05K 7/20318; H05K 7/20327; H05K 7/20381; H05K 7/2039
See application file for complete search history.

(56) References Cited

U.S. PATENT DOCUMENTS 10,231,358 B1 * 3/2019 Gillooly ............. H05K 7/20381
11,202,394 B1 12/2021 Weems et al.

(Continued)

FOREIGN PATENT DOCUMENTS

GB 2642241 A * 1/2026 ......... H05K 7/20745
WO WO-2023092213 A1 6/2023

OTHER PUBLICATIONS

International Search Report and Written Opinion for International Application No. PCT/US2025/018510, mailed on Jun. 20, 2025, 11 pages.

*Primary Examiner* — Gordon A Jones
(74) *Attorney, Agent, or Firm* — Sterne, Kessler, Goldstein & Fox P.L.L.C.

(57) ABSTRACT

A method of controlling a hybrid adiabatic cooling system to cool an interior of a data center includes a step of cooling, by a hybrid adiabatic cooler, a first cooling liquid circulating from a return segment of an outer conduit loop to a feed segment of the outer conduit loop. The method includes a step of exchanging, by a direct liquid cooling unit, heat between a second cooling liquid and the first cooling liquid circulating in the outer conduit loop. The method includes a step of diverting a portion of the first cooling liquid circulating in the outer conduit loop to an inner conduit loop. The method includes a step of exchanging, by a room air handling unit, heat between indoor ambient air and the diverted portion of the first cooling liquid circulating in the inner conduit loop.

13 Claims, 6 Drawing Sheets

Related U.S. Application Data

(60) Provisional application No. 63/561,437, filed on Mar. 5, 2024.

(52) U.S. Cl.
CPC ..... *H05K 7/20327* (2013.01); *H05K 7/20381* (2013.01); *H05K 7/2039* (2013.01)

(56) References Cited

U.S. PATENT DOCUMENTS

| | | | |
|---|---|---|---|
| 2011/0063792 | A1 | 3/2011 | Schmidt et al. |
| 2011/0100045 | A1 | 5/2011 | Carlson |
| 2011/0317367 | A1 | 12/2011 | Campbell et al. |
| 2018/0042140 | A1* | 2/2018 | Pan .................... H05K 7/20772 |
| 2019/0037730 | A1 | 1/2019 | Gao et al. |
| 2019/0179384 | A1 | 6/2019 | Sato |
| 2020/0284480 | A1 | 9/2020 | Tolouei Asbforoushani et al. |
| 2020/0413572 | A1 | 12/2020 | Martini |
| 2021/0307210 | A1 | 9/2021 | Wong et al. |
| 2021/0321526 | A1* | 10/2021 | Kulkarni ................ H05K 7/203 |
| 2021/0378149 | A1 | 12/2021 | Gao |
| 2022/0369519 | A1* | 11/2022 | Heydari ............. H05K 7/20818 |
| 2023/0058349 | A1 | 2/2023 | Mecozzi et al. |
| 2023/0301024 | A1* | 9/2023 | Gao ................... H05K 7/20818 361/679.53 |
| 2023/0309272 | A1 | 9/2023 | Narasimhan et al. |
| 2023/0400255 | A1* | 12/2023 | Uribe ......................... F28C 1/14 |
| 2024/0008225 | A1* | 1/2024 | Grabon ................ H05K 7/2079 |
| 2024/0247818 | A1* | 7/2024 | Costakis .................. F24F 11/83 |
| 2024/0341067 | A1 | 10/2024 | Martin et al. |
| 2025/0024630 | A1 | 1/2025 | Ge et al. |
| 2025/0071943 | A1 | 2/2025 | Fang et al. |
| 2025/0098125 | A1* | 3/2025 | Choi .................. H05K 7/20827 |
| 2026/0032865 | A1* | 1/2026 | Thé .................... H05K 7/20372 |

* cited by examiner

HYBRID DRY ADIABATIC COOLING CHILLED WATER PLANT FOR DATA CENTERS AND OTHER IT ENVIRONMENTS

CROSS-REFERENCE TO RELATED APPLICATIONS AND INCORPORATION BY REFERENCE

This application is a divisional application of U.S. patent application Ser. No. 18/949,183, filed Nov. 15, 2024, which claims priority to U.S. Provisional Patent Application No. 63/561,437 filed on Mar. 5, 2024, which are incorporated by reference herein in their entirety for all purposes.

FIELD

The present disclosure relates to methods and systems for cooling a data center, particularly for using free cooling and chiller assisted cooling to maintain operation temperatures in a data center.

BACKGROUND

Data centers and other IT environments typically consist of a facility used to house computer systems and associated components, such as servers, telecommunications, and storage systems. Data centers generally include redundant or backup power supplies, redundant data communications connections, redundant environmental controls (e.g., air conditioning, fire suppression) and security devices. Large data centers operating at industrial scale operations consume as much electricity as a small city.

One of the main concerns of this industry is business continuity. Companies rely on their information systems to run their operations. If a system becomes unavailable, business operations may be impaired or stopped completely. Reliable infrastructure is necessary for IT operations to minimize any chance of disruption. Information security is also a concern, and for this reason, a data center usually has to offer a secure environment to minimize the chances of a security breach. A data center must therefore keep high standards for assuring the integrity and functionality of its hosted computer environment. This is accomplished through redundancy of both fiber optic cables and power, which includes emergency backup power generation.

The physical environment of a data center is rigorously controlled to maintain IT operations. Air conditioning is commonly used to control the temperature and humidity in the data center. For example, current ASHRAE's "Thermal Guidelines for Data Processing Environments" recommends a temperature in a range from 18° C. to 27° C. (64.4° F. to 80.6° F.) and a dew point in a range from −9° C. to 15° C. (15.8° F. to 59.0° F.) to maintain optimal data center conditions. The temperature in a data center will naturally rise due to the electrical power dissipating heat into the air as a byproduct of the computing process. Unless the heat is removed, the ambient temperature will rise, resulting in electronic equipment malfunction. By controlling the air temperature, the server components at the board level are kept within the manufacturer's specified temperature/humidity range. Air conditioning systems help control humidity by cooling the return space air to below the dew point. Too much humidity may lead to condensation on internal components. In case of a dry atmosphere with low humidity, ancillary humidification systems may add water vapor. But the added water vapor may cause static electric discharge problems, potentially damaging the data center's components.

Data center heat removal is one of the most essential of all critical IT environment processes. As computing equipment is becoming smaller and increasing in power density, the high concentration of computing equipment in data centers consumes more electricity than the previous generations of IT equipment, thereby generating more heat in data centers.

Power draw for data centers ranges from a few kilowatts (kW) for a rack of servers in a closet to several tens of megawatts (MW) for large facilities. For higher power density facilities, electricity costs are a dominant operating expense. Precision cooling and heat rejection equipment is used to collect and transport unwanted heat energy in the data center to the outside atmosphere.

A cooling architecture for a data center is fundamentally described by: (i) a particular heat removal method, (ii) a particular air distribution type, and (iii) the location of the cooling unit(s) that directly supplies cool air and chilled water to the IT equipment.

IT environments of data centers are cooled by transferring unwanted heat energy from the data center's IT equipment to the outdoors using fundamental heat methods as explained below.

Heat removal is the process of "moving" heat energy from the IT space of the data center to the outdoors. This can be accomplished as easily as using an air duct to "transport" heat energy to the cooling system located outdoors. However, "movement" of heat energy is generally accomplished by using a heat exchanger to transfer heat energy from one fluid to another (e.g. from air to water). A computer room air handler unit(s) (also called a CRAH or CRAHU), combined with a chiller(s), a pump(s), is known as a chilled water system.

Conventional CRAHUs are similar to computer room air conditioners (CRAC) in appearance, but work differently. In a chilled water system, the components of the refrigeration cycle are relocated from the computer room air conditioning systems to a device called a water chiller. The function of the water chiller, or chiller, is to produce chilled water. Conventional CRAHUs cool air (remove heat) by drawing warm air from the computer room through the CRAHU to transfer the energy to the chilled water by running it through the chiller. The chiller removes the heat from the warmer chilled water and transfers it to another stream of circulating water called condenser water, which flows through a device known as a cooling tower. The cooling tower rejects heat taken from the IT room to the outdoor environment by spraying warm condenser water at the top of the tower onto corrugated material (called fill). The water spreads out, and some of the water evaporates away as it drips and flows to the bottom of the cooling tower. A fan is commonly used to help promote evaporation by drawing air through the fill material. In the same manner as the human body is cooled by the evaporation of sweat, the small amount of water that evaporates from the cooling tower serves to lower the temperature of the remaining water. The chilled water is pumped in pipes from the chiller to the CRAHs located in the IT environment.

There are three main types of chillers distinguished by their use of water or air to dissipate heat from the returning chilled water. First, water-cooled chillers use a condenser water loop to dissipate the heat from the returning chilled water to the outside atmosphere. The heated condenser water is cooled by a cooling tower—the final step in dissipating the heat to the outdoors. Water-cooled chillers are typically located indoors. Second, water/glycol-cooled chillers, which look identical to water-cooled chillers, typically use a coolant that contains glycol at 30% concentration by volume. In water/glycol-cooled chillers, heat from the returning chilled water is transferred to a glycol loop, which ultimately dissipates the transferred heat to the outside atmosphere. The glycol flows via pipes to an outdoor-mounted device called a dry cooler (also known as a fluid cooler). The heat in the warm glycol-filled coil of the dry cooler is dissipated to the outside atmosphere by a fan drawing outdoor air over the dry cooler's coils. Water is sprayed on the glycol-filled coils, and the evaporation of water adiabatically cools the air drawn over the coil. Glycol-cooled chillers are typically located indoors. Third, air-cooled chillers use an air-cooled condenser integrated with a chiller to dissipate heat from the returning chilled water. Compressors are integrated with an air-cooled chiller and cool the closed loop chilled water. The chilled water typically contains glycol at approximately 30% by volume. This type of chiller is known as a packaged chiller and can be integrated into a cooling system. Air-cooled chillers are typically located outdoors.

BRIEF SUMMARY

The present disclosure provides a hybrid adiabatic cooling system having one continuous first cooling liquid (e.g., water) loop that provides two distinct fluid temperatures using the same system infrastructure. The hybrid adiabatic cooling system is configured to accommodate a variety of different ambient outdoor conditions, which impact the process fluid temperatures within the loop. During low ambient temperature conditions, the hybrid adiabatic cooling system supplies the first cooling liquid at a desired operating temperature (e.g., 23° C., 73° F.) to both an air handling unit and a direct liquid cooling unit to address different heat loads of the data center without the use of chillers. As the ambient outdoor temperature exceeds a first temperature threshold (e.g., 18.3° C., 65.0° F.), a secondary pump and a chiller of the cooling system are initialized to maintain the first cooling liquid supplied to the air handling unit at the desired operating temperature (e.g., 22.8° C., 73.0° F.), while supplying the first cooling liquid to the direct liquid cooling unit at a maximum operating temperature (e.g., 32.2° C., 90.0° F.). All of these conditions are maintained using a single continuous piping network.

In some embodiments, the present disclosure provides a hybrid adiabatic cooling system. In some embodiments, the hybrid adiabatic cooling system includes an outer conduit loop that includes a feed segment to direct a first cooling liquid from outside the data center to inside the data center and a return segment to direct the first cooling liquid from inside the data center to outside the data center. In some embodiments, the hybrid adiabatic cooling system includes a hybrid adiabatic cooler disposed outside of the data center. The hybrid adiabatic cooler includes an outlet fluidly coupled to the feed segment of the outer conduit loop and an inlet fluidly coupled to the return segment of the outer conduit loop. The hybrid adiabatic cooler is configured to draw outdoor ambient air to cool the first cooling liquid circulating from the inlet of the hybrid adiabatic cooler to the outlet of the hybrid adiabatic cool. In some embodiments, the hybrid adiabatic cooling system includes a direct liquid cooling unit disposed inside the data center, the direct liquid cooling unit including an inlet fluidly coupled to the feed segment of the outer conduit loop to receive the first cooling liquid exiting the hybrid adiabatic cooler and an outlet coupled to the return segment of the outer conduit loop. The direct liquid cooling unit is configured to transfer heat from a second cooling liquid to the first cooling liquid circulating from the inlet of the direct liquid cooling unit to the outlet of the direct liquid cooling unit. In some embodiments, the hybrid adiabatic cooling system includes an inner conduit loop including a first segment fluidly coupled to the feed segment of the outer conduit loop and a second segment fluidly coupled to the return segment of the outer conduit loop. In some embodiments, the hybrid adiabatic cooling system includes an air handling unit disposed inside the data center. The air handling unit includes an inlet fluidly coupled to the first segment of the inner conduit loop and an outlet coupled to the second segment of the inner conduit loop. The air handling unit is configured to transfer heat from indoor ambient air drawn through the air handling unit to the first cooling liquid circulating from the inlet of the air handling unit to the outlet of the air handling unit In some embodiments, the hybrid adiabatic cooling system includes a chiller fluidly coupled to the first and second segments of the inner conduit loop, wherein the chiller is configured to cool the first cooling liquid circulating through the first segment of the inner conduit loop and heat the first cooling liquid circulating through the second segment of the inner conduit loop.

In some embodiments, the first segment of the inner conduit loop includes a feed line fluidly coupled to the feed segment of the outer conduit loop; a first chiller inlet line fluidly coupled to the feed line and a first inlet of the chiller; a chiller outlet line fluidly coupled to a first outlet of the chiller and the inlet of the air handling unit; and a bypass feed line fluidly coupled to the feed line and the chiller outlet line.

In some embodiments, the second segment of the inner conduit loop includes a discharge line fluidly coupled to the outlet of the air handling unit; a second chiller inlet line fluidly coupled to the discharge line and a second inlet of the chiller; a second chiller outlet line fluidly coupled to a second outlet of the chiller and the return segment of the outer conduit loop; and a bypass outlet line fluidly coupled to the discharge line and the return segment of the outer conduit loop.

In some embodiments, the chiller includes an evaporator section disposed between the first inlet and the first outlet of the chiller, wherein the evaporator section is configured to exchange heat between the first cooling liquid and a working fluid such that the working fluid is evaporated to a gaseous state. In some embodiments, the chiller includes a condenser section disposed between the second inlet and the second outlet of the chiller, wherein the condenser section is configured to exchange heat between the first cooling liquid and the working fluid such that the working fluid is condensed to a liquid state.

In some embodiments, the hybrid adiabatic cooling system includes a first valve fluidly coupled to the feed line, the first chiller inlet line, and the bypass feed line of the first segment of the inner conduit loop, wherein the first valve is configured to switch between a first position and a second position. When set in the first position, the first valve is configured to direct the first cooling liquid from the feed line to the bypass feed line. When set in the second position the first valve is configured to direct the first cooling liquid from the feed line to the first chiller inlet line.

In some embodiments, the hybrid adiabatic cooling system includes a controller in communication with the first valve, wherein the controller is configured to set the first valve in the first position when a temperature of the outdoor ambient air is below a first threshold temperature and in the second position when the temperature of the outdoor ambient air is below a first threshold temperature.

In some embodiments, the hybrid adiabatic cooling system includes a second valve fluidly coupled to the discharge line, the second chiller inlet line, and the bypass outlet line of the second segment of the inner conduit loop, wherein the second valve is configured to switch between a first position and a second position. When set in the first position, the second valve is configured to direct the first cooling liquid from the discharge line to the bypass outlet line. When set in the second position, the second valve is configured to direct the first cooling liquid from the discharge line to the second chiller inlet line.

In some embodiments, the controller is configured to set the second valve in the first position when the temperature of the outdoor ambient air is below the first threshold temperature and in the second position when the temperature of the outdoor ambient air is above the first threshold temperature.

In some embodiments, the hybrid adiabatic cooler includes an air inlet; an air outlet; a blower configured to draw the outdoor ambient air from the air inlet to the air outlet; a tube coil disposed between the air inlet and the air outlet, wherein the tube coil is fluidly coupled to the inlet and outlet of the hybrid adiabatic cooler; and an adiabatic pad disposed at the air inlet, wherein the adiabatic pad is configured to moisturize the outdoor ambient air drawn through the air inlet. In some embodiments, the hybrid adiabatic cooler is configured to operate in a dry mode such that the adiabatic pad is dry and in a wet mode such that the adiabatic pad is wet to moisturize the outer ambient air drawn through air inlet.

In some embodiments, the controller is in communication with the hybrid adiabatic cooler, and the controller is configured to set the hybrid adiabatic cooler in the dry mode when the temperature of the outdoor ambient air is below a second threshold temperature and in the wet mode when the temperature of the outdoor ambient air is above the second threshold temperature.

In some embodiments, the first threshold temperature is in a range from 55° F. to 75° F. (12.8° C. to 23.9° C.), and the second threshold temperature is in a range from 70° F. to 95° F. (21.1° C. to 35.1° C.).

In some embodiments, the first cooling liquid is water, and the second cooling liquid is a dielectric coolant.

In some embodiments, the present disclosure provides a hybrid adiabatic cooling system. In some embodiments, the hybrid adiabatic cooling system includes an outer conduit loop including a feed segment and a return segment. In some embodiments, the hybrid adiabatic cooling system includes an inner conduit loop including a first segment fluidly coupled to the feed segment and a second segment fluidly coupled the return segment of the outer conduit loop. In some embodiments, the hybrid adiabatic cooling system includes a hybrid adiabatic cooler fluidly coupled to the outer conduit loop. The hybrid adiabatic cooler is configured to draw outdoor ambient air to cool a first cooling liquid circulating from the return segment to the feed segment of the outer conduit loop. In some embodiments, the hybrid adiabatic cooling system includes a direct liquid cooling unit fluidly coupled to the outer conduit loop. The direct liquid cooling unit is configured to transfer heat from a second cooling liquid to the first cooling liquid circulating from the feed segment to the return segment of the outer conduit loop. In some embodiments, the hybrid adiabatic cooling system includes an air handling unit fluidly coupled to the inner conduit loop. The air handling unit is configured to transfer heat from indoor ambient air drawn through the air handling unit to the first cooling liquid circulating from the first segment to the second segment of the inner conduit loop. In some embodiments, the hybrid adiabatic cooling system includes a chiller fluidly coupled to the first segment of the inner conduit loop. The chiller is configured to cool the first cooling liquid circulating through the first segment of the inner conduit loop. In some embodiments, the hybrid adiabatic cooling system includes a controller configured to operate the hybrid adiabatic cooling system in a free cooling mode when a temperature of the outdoor ambient air is less than a first threshold temperature and a chiller mode when the temperature of the outdoor ambient air is greater than a first threshold temperature. In some embodiments, when the hybrid adiabatic cooling system is set in the free cooling mode, the first cooling liquid in the first segment of inner conduit loop bypasses the chiller. In some embodiments, when the hybrid adiabatic cooling system is set in the chiller mode, the first cooling liquid in the first segment of inner conduit loop circulates through the chiller.

In some embodiments, the hybrid adiabatic cooling system includes a first pump fluidly coupled to the outer conduit loop, the first pump configured to propel the first cooling liquid through the outer conduit loop. In some embodiments, the hybrid adiabatic cooling system includes a second pump fluidly coupled to the first segment of the second conduit loop. The second pump is configured to propel the first cooling liquid circulating in the first segment of the inner conduit loop through the chiller.

In some embodiments, the controller is in communication with the first pump and the second pump, and the controller is configured to deactivate the second pump when setting the hybrid adiabatic cooling system in the free cooling mode and activate the second pump when setting the hybrid adiabatic cooling system in the chiller mode.

In some embodiments, the hybrid adiabatic cooler is configured to operate in a dry mode and a wet mode. When set in the dry mode, the hybrid adiabatic does not moisture the outdoor ambient air drawn through the hybrid adiabatic cooler. When set in the wet mode, the hybrid adiabatic cooler moisturizes outdoor ambient air drawn through the hybrid adiabatic cooler.

In some embodiments, the controller is in communication with the hybrid adiabatic cooler, and the controller is configured to set the hybrid adiabatic cooler in the dry mode when the temperature of the outdoor ambient air is below a second threshold temperature and in the wet mode when the temperature of the outdoor ambient air is above the second threshold temperature. The second threshold temperature is greater than the first threshold temperature.

In some embodiments, the present disclosure provides a method of controlling a hybrid adiabatic cooling system to cool an interior of a data center. In some embodiments, the method includes a step of cooling, by a hybrid adiabatic cooler, a first cooling liquid circulating from a return segment of an outer conduit loop to a feed segment of the outer conduit loop. In some embodiments, the method includes a step of exchanging, by a direct liquid cooling unit, heat between a second cooling liquid and the first cooling liquid circulating from the feed segment of the outer conduit loop to the return segment of the outer conduit loop. In some embodiments, the method includes a step of diverting a portion of the first cooling liquid circulating in the feed segment of the outer conduit loop to a first segment of an inner conduit loop. In some embodiments, the method includes a step of determining, by a controller, to operate the hybrid adiabatic cooling system in a free cooling mode or a chiller mode based on a temperature of outdoor ambient air drawn through the hybrid adiabatic cooler to cool the first cooling liquid. In some embodiments, the method includes a step of exchanging, by a room air handling unit, heat between indoor ambient air and the diverted portion of the first cooling liquid circulating from the first segment of the inner conduit loop to a second segment of the inner conduit loop that is fluidly coupled to the return segment of the outer conduit loop. In some embodiments, the diverted portion of the first cooling liquid in the first segment of the inner conduit loop bypasses a chiller when the hybrid adiabatic cooling system is set in the free cooling mode. In some embodiments, the diverted portion of the first cooling liquid in the first segment of the inner conduit loop circulates through the chiller when the hybrid adiabatic cooling system is set in the chiller mode.

In some embodiments, the controller determines to operate the hybrid adiabatic cooling system in the free cooling mode when the temperature of the outdoor ambient air is less than a first threshold temperature and in the chiller mode when the temperature of the outdoor ambient air is above than a first threshold temperature.

In some embodiments, the present disclosure provides a controller for a hybrid adiabatic cooling system that includes an outer conduit loop circulating through a data center and an inner conduit loop fluidly coupled to the outer conduit loop. In some embodiments, the controller comprises an input interface configured to receive a temperature signal from an outdoor temperature sensor indicating a temperature of outdoor ambient air. In some embodiments, the controller comprises an output interface configured to transmit an actuation signal to a primary pump to circulate a first cooling liquid from a feed segment of the outer conduit loop to a return segment of the outer conduit loop and through the inner conduit loop fluidly coupled to the feed segment and the return segment of the outer conduit loop. In some embodiments, the outer conduit loop is fluidly coupled to a direct liquid cooling unit disposed in the data center and the inner conduit loop is fluidly coupled to an air handling unit disposed in the data center. In some embodiments, the output interface is configured to transmit an actuation signal to a secondary pump to circulate the first cooling liquid through a chiller fluidly coupled to the inner conduit loop and located upstream of the air handling unit. In some embodiments, the output interface is configured to transmit an actuation signal to a hybrid adiabatic cooler to moisturize the outdoor ambient air drawn through an air inlet of the hybrid adiabatic cooler such that the hybrid adiabatic cooler adiabatically cools the first cooling liquid circulating from the return segment to the feed segment of the outer conduit loop. In some embodiments, the controller comprises a processor in electrical communication with the input interface to receive the temperature signal from the input interface and in electrical communication with the output interface to transmit the actuation signal selectively to the primary pump, the secondary pump, and the hybrid adiabatic cooler. In some embodiments, the processor is configured to operate the hybrid adiabatic cooling system in a: (i) free cooling mode by activating the primary pump and deactivating the secondary pump, (ii) a dry chiller mode by activating the primary pump and the secondary pump, and (iii) a wet chiller mode by activating the primary pump and the secondary pump and actuating the hybrid adiabatic cooler to moisturize the outdoor ambient air. In some embodiments, the processor is configured to determine to operate the hybrid adiabatic cooling system in the free cooling mode, the dry chiller mode, and the wet chiller mode based on the temperature signal received from the outdoor temperature sensor.

BRIEF DESCRIPTION OF THE FIGURES

The accompanying drawings, which are incorporated herein and form part of the specification, illustrate embodiments and, together with the description, further serve to explain the principles of the embodiments and to enable a person skilled in the relevant art(s) to make and use the embodiments.

Figure 1:
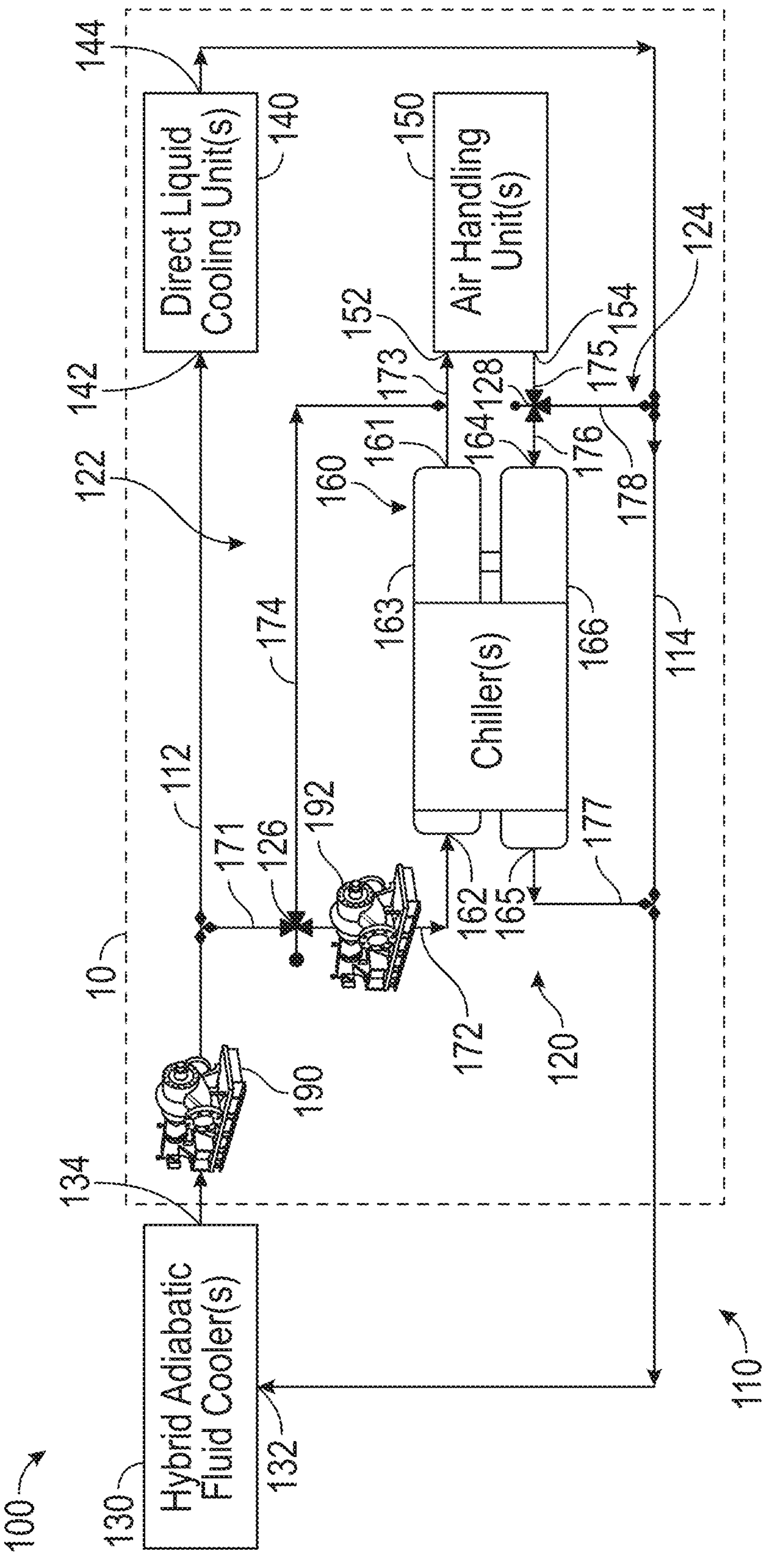
FIG. 1 illustrates a schematic circuit diagram of the hybrid adiabatic cooling system according to an embodiment.

The features and advantages of the embodiments will become more apparent from the detail description set forth below when taken in conjunction with the drawings. A person of ordinary skill in the art will recognize that the drawings may use different reference numbers for identical, functionally similar, and/or structurally similar elements, and that different reference numbers do not necessarily indicate distinct embodiments or elements. Likewise, a person of ordinary skill in the art will recognize that functionalities described with respect to one element are equally applicable to functionally similar, and/or structurally similar elements.

DETAILED DESCRIPTION

Embodiments of the present disclosure are described in detail with reference to embodiments thereof as illustrated in the accompanying drawings. References to "one embodiment," "an embodiment," "some embodiments," "certain embodiments," etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "upstream" and "downstream" as used herein refer to the relative location of a component (e.g., cooling unit) with respect to the direction of fluid flow. For example, the term "upstream," as used herein, refers to a relative position of a component in a conduit loop that is not as far along in the direction of the fluid flow. The term "downstream," as used herein, refers to a relative position in a conduit loop that is farther along in the direction of fluid flow.

The following examples are illustrative, but not limiting, of the present embodiments. Other suitable modifications and adaptations of the variety of conditions and parameters normally encountered in the field, and which would be apparent to those skilled in the art, are within the spirit and scope of the disclosure.

Thermal management of electrical equipment in data centers is essential for maintaining operability. Conventional data center's cooling systems routinely condition the air of the data center's interior space to a predetermined temperature and directly cool the data center's electric components through thermal conduction or immersive cooling with a coolant. However, a significant amount of energy is consumed to maintain operable conditions (temperature and humidity) for data centers, particular facilities including a high concentration of computing equipment. Thus, there is a need for a data center cooling system that can cool the interior air of the data center and direct liquid cooling of the electronic components, while consuming lower energy and less water.

According to embodiments described herein, a hybrid adiabatic cooling system of the present disclosure can overcome one or more of these deficiencies, for example, by providing a closed loop of a first cooling liquid (e.g. water) that directs the first cooling liquid to two distinct heat loads of the data center at two different temperatures. The hybrid adiabatic cooling system includes an inner conduit loop and an outer conduit loop fluidly coupled to the inner conduit loop. The inner conduit loop supplies the first cooling liquid to a computer room air handling unit that generates cool air to convectively cool electric equipment in the data center. The outer conduit loop supplies the first cooling liquid to direct liquid cooling unit that uses a second cooling liquid to directly cool the electric equipment of the data center. The hybrid adiabatic cooling system includes a hybrid adiabatic cooler fluidly coupled to the outer conduit loop to cool the first cooling liquid returned from the heat loads in the data center. When the outdoor ambient temperature is below a first threshold temperature (e.g., 65.0° F., 18.3° C.), the hybrid adiabatic cooler supplies chilled first cooling liquid to the outer and inner conduit loops at an operating temperature without the use of mechanical refrigeration to cool the first cooling liquid, thereby reducing the energy consumption of the cooling system.

FIG. 1 illustrates a hybrid adiabatic cooling system 100 according to an embodiment. Hybrid adiabatic cooling system 100 circulates a first cooling liquid, such as water, in a closed loop through a data center 10—a building having a confined space for housing a network of computer systems, servers, telecommunication devices, and servers—to assist the thermal management of electronic components stored in data center 10. Hybrid adiabatic cooling system 100 may supply the first cooling liquid at two different temperatures to two different types of cooling units—for example, a direct liquid cooling unit and an air handling unit—located in data center 10 such that the hybrid adiabatic cooling system 100 dissipates heat from the data center's electronic components by two modes of heat exchange: direct liquid cooling the electronic components and air conditioning the internal space of data center 10.

In some embodiments, hybrid adiabatic cooling system 100 may include an outer conduit loop 110 to direct chilled first cooling liquid (e.g., water) to one or more cooling units (e.g., a direct liquid cooling unit) located in data center 10 and return heated first cooling liquid discharged from the one or more cooling units out of data center 10. For example, outer conduit loop 110 may include a feed segment 112 to direct the chilled first cooling liquid from the outside of data center 10 to a first set of cooling units (e.g., a direct liquid cooling unit 140) located inside of data center 10. Outer conduit loop 110 may include a return segment 114 to direct the heated first cooling liquid discharged from the one or more cooling units to outside of data center 10 so that heat in the first cooling liquid may be dissipated to the outdoor ambient air. Feed segment 112 and return segment 114 of outer conduit loop 110 may include a network of pipes, tubes, conduits, hoses, and/or fluid lines suitable for circulating the first cooling liquid through outer conduit loop 110. In some embodiments, feed segment 112 and return segment 114 may each consist of a single pipe, tube, or conduit for circulating the first cooling liquid.

In some embodiments, hybrid adiabatic cooling system 100 may include an inner conduit loop 120 to direct the chilled first cooling liquid from feed segment 112 of outer conduit loop 110 to one or more cooling units (e.g., an air handling unit) located in data center 10 and direct the heated first cooling liquid discharged from the one or more cooling units to return segment 114 of outer conduit loop 110. For example, inner conduit loop 120 may include a first segment 122 fluidly coupled to feed segment 112 of outer conduit loop 110 and a second set of cooling units (e.g., air handling unit 150) that are distinct from the first set of cooling units. Inner conduit loop 120 may include a second segment 124 fluidly coupled to the second set of cooling units and return segment 114 of outer conduit loop 110. First segment 122 and second segment 124 of inner conduit loop 120 may include a network of pipes, tubes, conduits, hoses, and/or fluid lines suitable for circulating the first cooling liquid through inner conduit loop 120.

In some embodiments, hybrid adiabatic cooling system 100 may include a hybrid adiabatic cooler 130 located outside of data center 10. Hybrid adiabatic cooler 130 may be fluidly coupled to outer conduit loop 110. Hybrid adiabatic cooler 130 may cool the first cooling liquid (e.g., water) circulating through outer conduit loop 110 by dissipating heat from the first cooling liquid to the outdoor ambient air. Hybrid adiabatic cooler 130 may include an inlet 132 fluidly coupled to return segment 114 of outer conduit loop 110 to receive the heated first cooling liquid discharged from the one or more cooling units (e.g., a direct liquid cooling unit 140 and an air handling unit 150) located in data center 10. Hybrid adiabatic cooler 130 may include an outlet 134 fluidly coupled to feed segment 112 of outer conduit loop 110 to supply cooled first cooling liquid to the one or more cooling units located in data center 10.

Hybrid adiabatic cooler 130 may operate in two modes: a dry mode and a wet mode. When hybrid adiabatic cooler 130 is set in the dry mode, the outdoor ambient air is drawn through hybrid adiabatic cooler 130 without moisturizing the air intake such that the dry-bulb temperature of the air is not cooled before dissipating heat from the first cooling liquid. When hybrid adiabatic cooler 130 is set in a wet mode, the outdoor ambient air drawn through hybrid adiabatic cooler 130 is moisturized such that the air intake is cooled under the concept of adiabatic evaporative cooling before dissipating heat from the first cooling liquid. During wet mode, the moisture added to the outdoor ambient air drawn through the hybrid adiabatic cooler 130 is evaporated to cool the dry-bulb temperature of the air to its wet-bulb temperature as the enthalpy of moisten air remains constant.

The adiabatically cooled air drawn through hybrid adiabatic cooler 130 during wet mode will have a higher humidity level and a lower dry-bulb temperature than the non-moisturized air drawn through hybrid adiabatic cooler 130 during dry mode, thereby dissipating heat from the first cooling liquid at a higher rate.

Figure 2A:
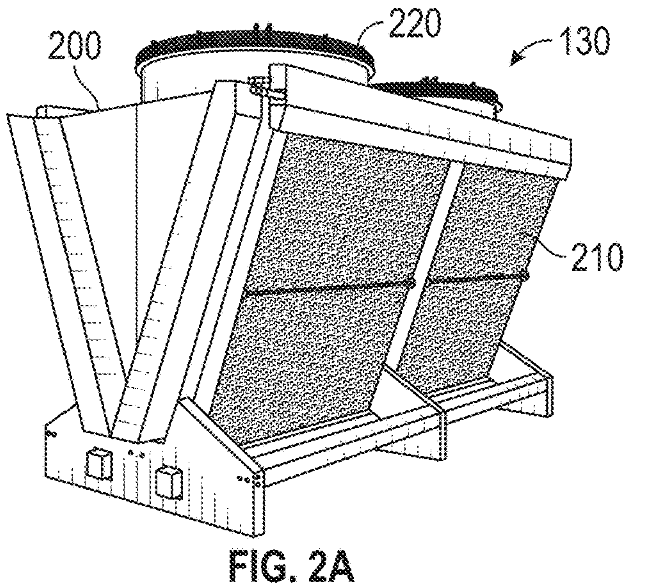
FIG. 2A illustrates a perspective view of a hybrid adiabatic cooler according to an embodiment.
Figure 2B:
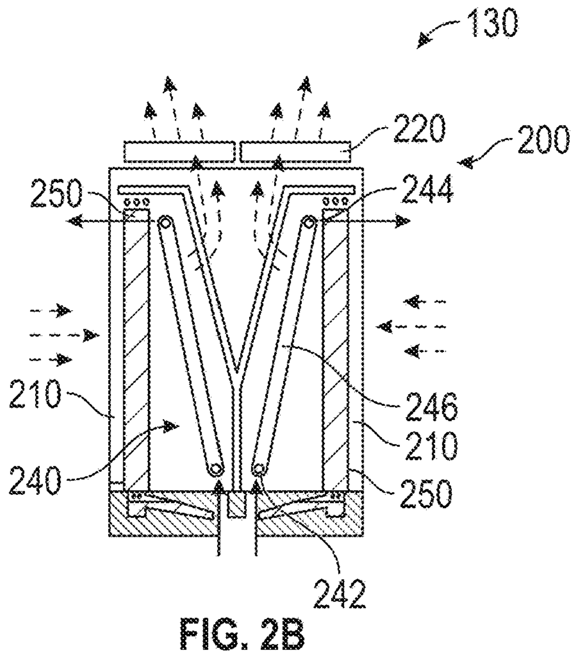
FIG. 2B illustrates a cross-sectional view of a hybrid adiabatic cooler according to an embodiment.

FIGS. 2A and 2B illustrates one embodiment of hybrid adiabatic cooler 130. Hybrid adiabatic cooler 130 may include a housing 200 defining an air inlet 210 for receiving outdoor ambient air and an air outlet 220 for discharging outdoor ambient air. Hybrid adiabatic cooler 130 may include a blower to draw the outdoor ambient air from air inlet 210 to air outlet 220. In some embodiments, the fan speed of blower may be adjustable to control the flow rate of air intake. Hybrid adiabatic cooler 130 may include a heat exchanger 240 disposed between air inlet 210 and air outlet 220. Heat exchanger 240 may be fluidly coupled to inlet 132 and outlet 134 of hybrid adiabatic cooler 130 to circulate the first cooling liquid (e.g., water) from return segment 114 of outer conduit loop 110 to feed segment 112 of outer conduit loop 110. In some embodiments, heat exchanger 240 may include an inlet header 242, an outlet header 244, and a plurality of tube bundles 246 fluidly coupled to inlet header 242 and outlet header 244. Hybrid adiabatic cooler 130 may include an adiabatic pad 250 disposed proximate to air inlet 210 to moisturize air drawn through air inlet 210. In some embodiments, adiabatic pad 250 may include an open-mesh panel, such as a matrix of glass fiber and ceramic composite materials, which is configured to be saturated with water to moisturize air passing therethrough.

With reference to FIG. 1, in some embodiments, hybrid adiabatic cooling system 100 may include a direct liquid cooling unit 140 located inside data center 10 and fluidly coupled to outer conduit loop 110. Direct liquid cooling unit 140 exchanges heat between a second cooling liquid (e.g., a coolant) directed to cooling electric components of data center 10 and the first cooling liquid (e.g., water) circulating through outer conduit loop 110. By cooling the second cooling liquid, direct liquid cooling unit 140 heats the first cooling liquid circulating from feed segment 112 to return segment 114 of outer conduit loop 110. Direct liquid cooling unit 140 may include an inlet 142 fluidly coupled to feed segment 112 of outer conduit loop 110 to receive the chilled first cooling liquid (e.g., water) supplied from outlet 134 of hybrid adiabatic cooler 130. Direct liquid cooling unit 140 may include an outlet 144 fluidly coupled to return segment 114 of outer conduit loop 110 to direct the heated first cooling liquid to inlet 132 of hybrid adiabatic cooler 130.

Figure 3:
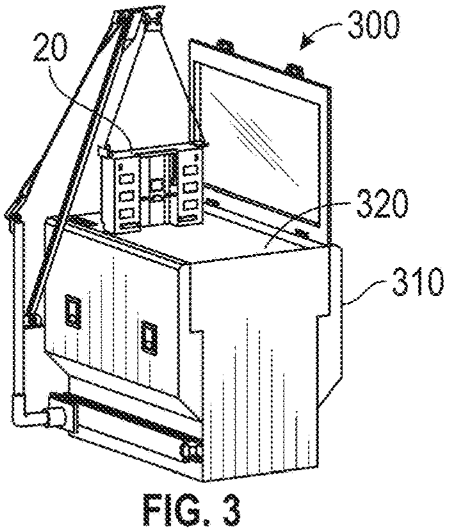
FIG. 3 illustrates a perspective view of a direct liquid cooling unit according to an embodiment.

FIG. 3 illustrates a direct liquid cooling unit 300 according to one embodiment. Direct liquid cooling unit 300 may cool electric components 20 of data center 10 by directly contacting electric components 20 with a dielectric coolant used as the second cooling liquid. For example, as shown in FIG. 3, direct liquid cooling unit 300 may include a housing 310 defining a tank 320 filled with dielectric coolant to immerse electric components 20. Direct liquid cooling unit 300 may include a heat exchanger disposed in housing 310 to exchange heat between the second cooling liquid (e.g., dielectric coolant) and the first cooling liquid (e.g., water) circulating through direct liquid cooling unit 300. In some embodiments, the second cooling liquid may include perfluorinated carbons and/or polyalphaolefin hydrocarbons.

Figure 4:
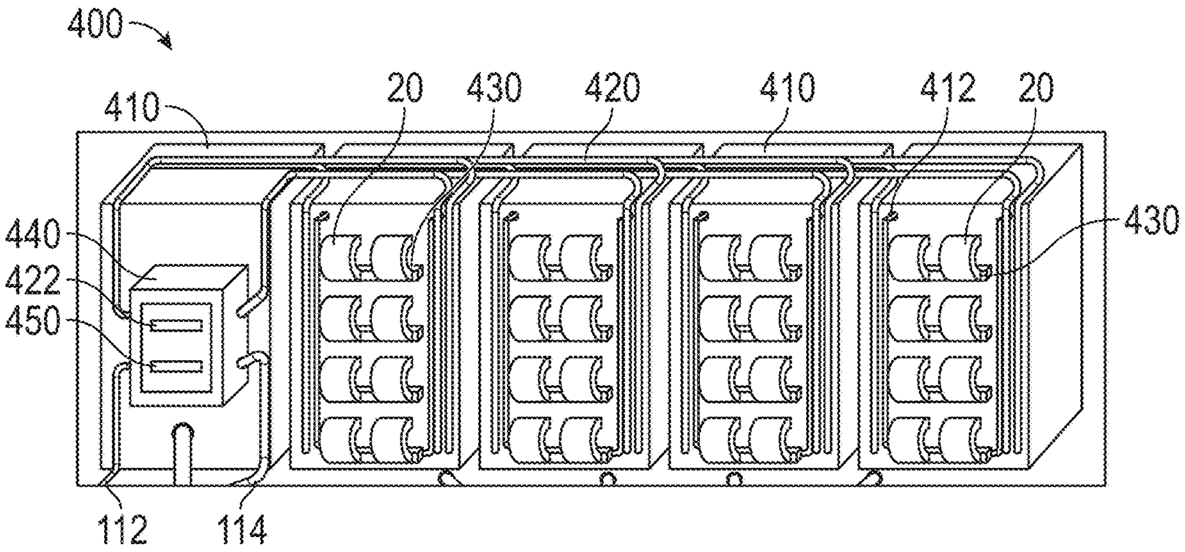
FIG. 4 illustrates a perspective view of a direct liquid cooling unit according to an embodiment.

FIG. 4 illustrates a direct liquid cooling unit 400 according to one embodiment. Direct liquid cooling unit 400 may cool electric components 20 of data center 10 by indirectly contacting the electric components 20 with the second cooling liquid through a cold plate 430. For example, as shown in FIG. 4, direct liquid cooling unit 400 may include a housing 410 having a plurality of racks 412 holding electric components 20 and a coolant loop 420 fluidly coupled to cold plates 430, which are in thermal contact with electric components 20. Direct liquid cooling unit 400 may circulate a second cooling liquid 422 (e.g., coolant) through coolant loop 420 to direct second cooling liquid 422 through cold plates 430. Direct liquid cooling unit 400 may include a heat exchanger 440 disposed in housing 410 to exchange heat between second cooling fluid 422 and a first cooling liquid 450 (e.g., water) circulating through direct liquid cooling unit 400.

With reference to FIG. 1, in some embodiments, hybrid adiabatic cooling system 100 may include an air handling unit 150 located inside data center 10 and fluidly coupled to inner conduit loop 120. Air handling unit 150 exchanges heat between indoor ambient air of data center 10 and the first cooling liquid (e.g., water) circulating through inner conduit loop 120. In cooling the indoor ambient air of data center 10, air handling unit 150 heats the first cooling liquid while circulating from first segment 122 to second segment 124 of inner conduit loop 120. Air handling unit 150 may include an inlet 152 fluidly coupled to first segment 122 of inner conduit loop 120 to receive the chilled first cooling liquid diverted from feed segment 112 of inner conduit loop 110. Air handling unit 150 may include an outlet 154 fluidly coupled to second segment 124 of inner conduit loop 120 to direct the diverted portion of heated first cooling liquid to return segment 114 of outer conduit loop 110.

Figure 5A:
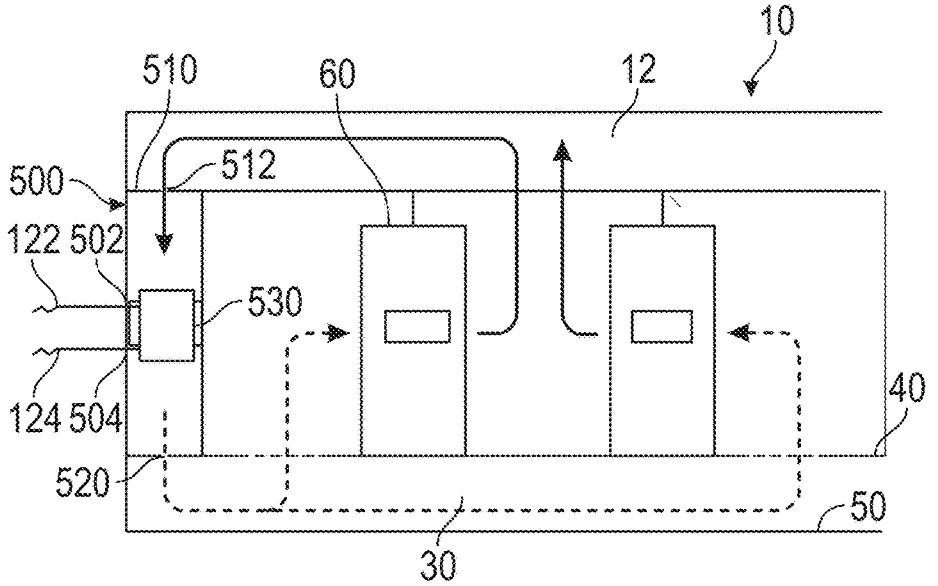
FIG. 5A illustrates an air handling unit according to an embodiment.

FIG. 5A illustrates one embodiment of an air handling unit 500. Air handling unit 500 may include a housing 510. Housing 510 of air handling unit 500 may define an air inlet 512 for receiving indoor ambient air of a room 12 in data center 10 and an air outlet 520 for discharging conditioned air. In some embodiments, as shown in FIG. 5A, air outlet 520 opens into a plenum 30 defined between a room floor 40 and a base floor 50 of data center 10 that defines an air passage opening into aisles defined between rows of racks 60, where each rack 60 houses electric components 20 of data center 10. Air handling unit 500 may include a fan to draw heated air exhausted from racks 60 through air inlet 512. Air handling unit 500 may include a heat exchanger 530 disposed between air inlet 512 and air outlet 520. Heat exchanger 530 may be fluidly coupled to an inlet 502 and an outlet 504 of air handling unit 500 to circulate the first cooling liquid from first segment 122 of inner conduit loop 120 to second segment 124 of inner conduit loop 120. Heat exchanger 530 cools the air drawn through air handling unit 500 such that first cooling liquid (e.g., water) is heated.

Figure 5B:
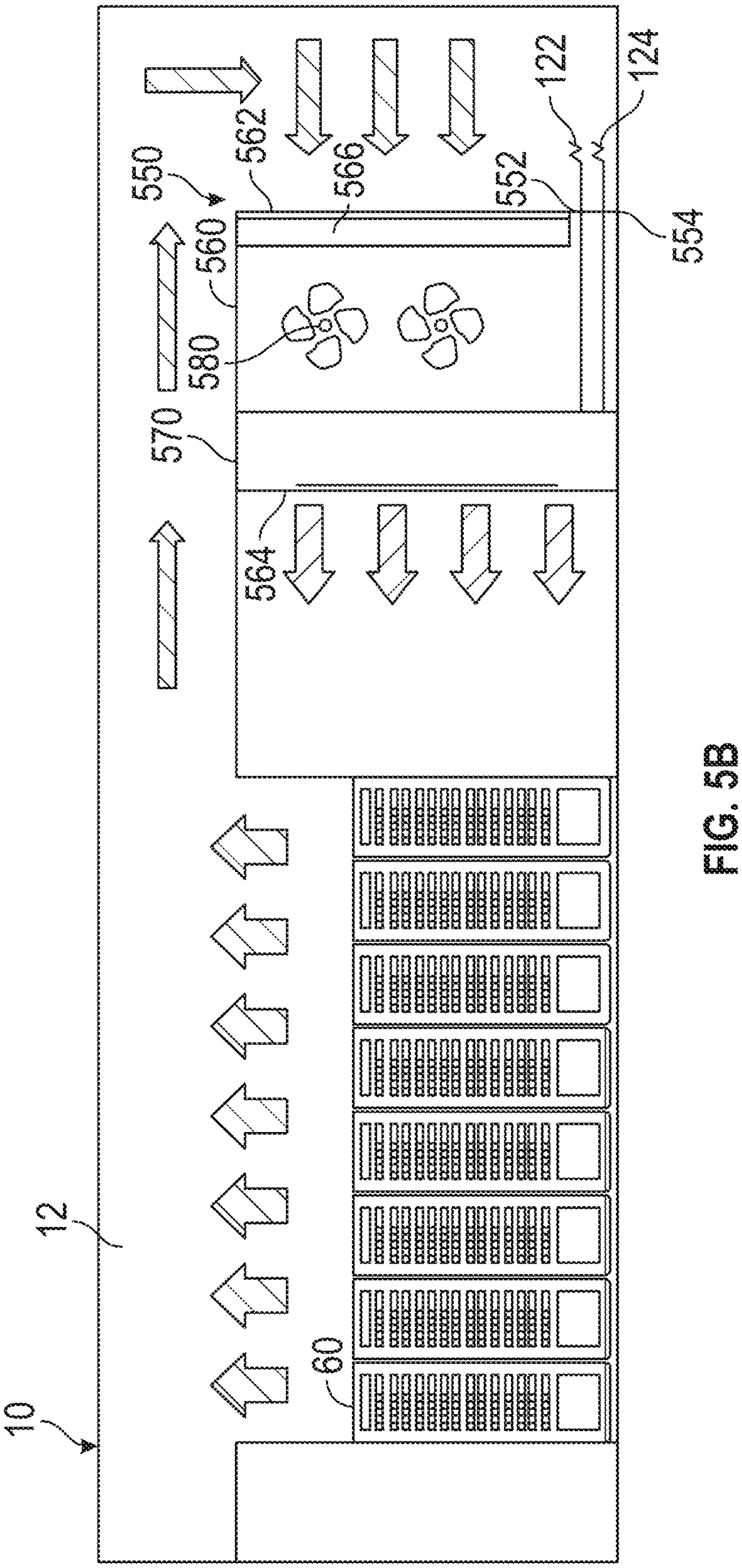
FIG. 5B illustrates an air handling unit according to an embodiment.

FIG. 5B illustrates another embodiment of an air handling unit 550. Air handling unit 550 may include a housing 560. Housing 560 of air handling unit 550 may define an air inlet 562 for receiving indoor ambient air of room 12 in data center 10 and an air outlet 564 for discharging cooled air. In some embodiments, as shown in FIG. 5B, air outlet 564 opens directly into room 12 of data center 10 to direct cooled air between rows of racks 60 of data center 10. Air handling unit 550 may include one or more fans 580 to draw heated air exhausted from racks 60 through air inlet 562. Air handling unit 550 may include a filter 566 disposed at air inlet 562 to remove particulates from the heated air recirculated through air handling unit 550. Air handling unit 550 may include a heat exchanger 570 disposed between air inlet 562 and air outlet 564. Heat exchanger 570 may be fluidly coupled to an inlet 552 and an outlet 554 of air handling unit 550 to circulate the first cooling liquid from first segment 122 of inner conduit loop 120 to second segment 124 of inner conduit loop 120. Heat exchanger 570 cools the air drawn through air handling unit 550 such that first cooling liquid (e.g., water) is heated.

In some embodiments, hybrid adiabatic cooling system 100 may include a chiller 160 fluidly coupled to inner conduit loop 120. Chiller 160 may circulate a working fluid (e.g., a refrigerant in a refrigerant cycle or water) to cool the first cooling liquid circulating through first segment 122 of inner conduit loop 120 and to heat the first cooling liquid circulating through second segment 124 of the inner conduit loop 120. For example, chiller 160 may include an evaporator section 163 having a bundle of tubes to transfer heat from the first cooling liquid circulating through first segment 122 of inner conduit loop 120 to the liquid working fluid such that the liquid working fluid is evaporated to a gaseous state. Evaporator section 163 of chiller 160 may include a first inlet 161 fluidly coupled to first segment 122 of inner conduit loop 120 and a first outlet 162 fluidly coupled to first segment 122 of inner conduit loop 120 to allow the first cooling liquid to circulate through evaporator section 163 of chiller 160. Chiller 160 may include a condenser section 166 having a bundle of tubes to transfer heat from the gaseous working fluid to the first cooling liquid circulating through second segment 124 of inner conduit loop 120 such that the gaseous working fluid is condensed to a liquid state. Condenser section 166 of chiller 160 may include a second inlet 164 fluidly coupled to second segment 124 of inner conduit loop 120 and a second outlet 165 fluidly coupled to second segment 124 of inner conduit loop 120 to circulate the first cooling liquid through condenser section 166 of chiller 160.

In some embodiments, first segment 122 and second segment 124 of inner conduit loop 120 may include a combination of fluid lines (e.g., pipes, tube, conduits) and one or more valves to selectively allow the first cooling liquid (e.g., water) to bypass chiller 160. In bypassing chiller 160, the first cooling liquid circulates through all the data center's cooling units (e.g., direct liquid cooling unit 140, air handling unit 150) without the use of mechanical refrigeration ("free cooling").

For example, in some embodiments, first segment 122 of inner conduit loop 120 may include a feed line 171 fluidly coupled to feed segment 112 of outer conduit loop 110 to divert the chilled first cooling liquid from feed segment 112 toward air handling unit 150. First segment 122 of inner conduit loop 120 may include a first chiller inlet line 172 fluidly coupled to feed line 171 and first inlet 161 of chiller 160 to direct the diverted portion of the first cooling liquid to evaporator section 163 of chiller 160. First segment 122 of inner conduit loop 120 may include a first chiller outlet line 173 fluidly coupled to first outlet 162 of chiller 160 and inlet 152 of air handling unit 150 to direct the diverted portion of the first cooling liquid from evaporator section 163 of chiller 160 to air handling unit 150. First segment 122 of inner conduit loop 120 may include a bypass feed line 174 fluidly coupled to feed line 171 and first chiller outlet line 173 such that diverted portion of the first cooling liquid bypasses evaporator section 163 of chiller 160 while circulating to inlet 152 of air handling unit 150.

In some embodiments, inner conduit loop 120 may include a first valve 126 fluidly coupled to feed line 171, first chiller inlet line 172, and bypass feed line 174 of first segment 122 of the inner conduit loop 120. First valve 126 switches between a first position and a second position to alternate the direction of the first cooling liquid circulating through first segment 122 of inner conduit loop 120. For example, when set in the first position, first valve 126 directs the first cooling liquid from feed line 171 to bypass feed line 174 such that the portion of the first cooling liquid diverted from feed segment 112 of outer conduit loop 110 to air handling unit 150 bypasses evaporator section 163 of chiller 160. When set in the second position, first valve 126 directs the first cooling liquid from feed line 171 to first chiller inlet line 172 to circulate the first cooling liquid circulates through evaporator section 163 of chiller 160, such that the first cooling liquid is cooled by evaporator section 163 of chiller 160 (e.g., by mechanical refrigeration) before reaching first inlet 152 of air handling unit 150. In some embodiments, first segment 122 of inner conduit loop 120 may include two two-way valves, rather than one three-way valve, to selectively direct the first cooling liquid from feed line 171 to either first chiller inlet line 172 or bypass feed line 174.

In some embodiments, second segment 124 of inner conduit loop 120 may include a discharge line 175 fluidly coupled to outlet 154 of air handling unit 150 to receive the diverted portion of the first cooling liquid discharged from air handling unit 150. Second segment 124 of inner conduit loop 120 may include a second chiller inlet line 176 fluidly coupled to discharge line 175 and second inlet 164 of chiller 160 to direct the diverted portion of the first cooling liquid to condenser section 166 of chiller 160. Second segment 124 of inner conduit loop 120 may include a second chiller outlet line 177 fluidly coupled to second outlet 165 of chiller 160 and return segment 114 of outer conduit loop 110 such that diverted portion of the first cooling liquid discharged from condenser section 166 of chiller is merged back to the first cooling liquid circulating through return segment 114 of outer conduit loop 110. Second segment 124 of inner conduit loop 120 may include a bypass outlet line 178 fluidly coupled to discharge line 175 and return segment 114 of outer conduit loop 110 such that the diverted portion of first cooling liquid discharged from air handling unit 150 bypasses condenser section 166 of chiller 160 while merging back with the first cooling liquid circulating through return segment 114 of outer conduit loop 110.

In some embodiments, inner conduit loop 120 may include a second valve 128 fluidly coupled to discharge line 175, second chiller inlet line 176, and bypass outlet line 178 of second segment 124 of inner conduit loop 120. Second valve 128 switches between a first position and a second position to alternate the direction of the first cooling liquid circulating through second segment 124 of inner conduit loop 120. For example, when set in the first position, second valve 128 directs the first cooling liquid from discharge line 175 to bypass outlet line 178 such that first cooling liquid bypasses condenser section 166 of chiller 160. When set in the second position, second valve 128 directs the first cooling liquid from discharge line 175 to second chiller inlet line 176 such that the first cooling liquid is further heated by condenser section 166 of chiller 160 (e.g., by mechanical refrigeration) before merging with the first cooling liquid circulating through return segment 114 of outer conduit loop 110. In some embodiments, second segment 124 of inner conduit loop 120 may include two two-way valves, rather than one three-way valve, to selectively direct the first cooling liquid from discharge line 175 to either second chiller inlet line 176 or bypass outline line 178.

In some embodiments, hybrid adiabatic cooling system 100 may include a primary pump 190 fluidly coupled to outer conduit loop 110 to propel the first cooling liquid through outer conduit loop 110. Hybrid adiabatic cooling system 100 may include a secondary pump 192 fluidly coupled to inner conduit loop 120 to propel the first cooling liquid through inner conduit loop 120, including through chiller 160.

While FIG. 1 illustrates one hybrid adiabatic cooler 130, one direct liquid cooling unit 140, one air handling unit 150, one chiller 160, one primary pump 190, and one secondary pump 192, hybrid adiabatic cooling system 100 may include a plurality of hybrid adiabatic coolers, direct liquid cooling units, air handling units, chillers, primary pumps, and secondary pumps without departing from the scope of the present disclosure.

While FIG. 1 illustrates direct liquid cooling unit 140 fluidly coupled to outer conduit loop 110 and air handling unit 150 and chiller 160 fluidly coupled to inner conduit loop 120, in other embodiments, hybrid adiabatic cooling system 100 may include a direct liquid cooling unit fluidly coupled to the inner conduit loop and an air handling unit and a chiller fluidly coupled to the outer conduit loop without departing from the scope of the present disclosure.

Figure 6:
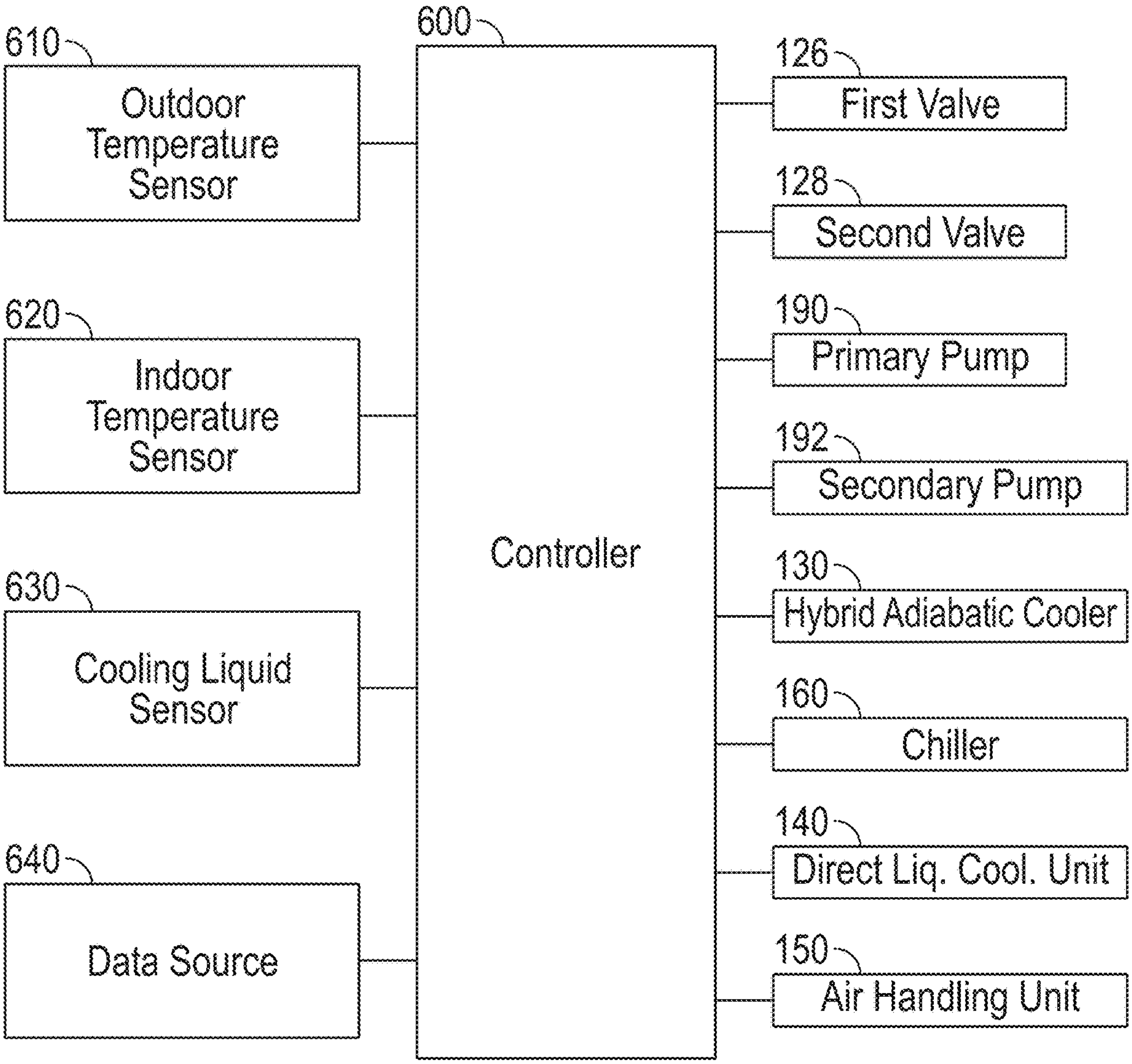
FIG. 6 illustrates a schematic diagram of a controller for a hybrid adiabatic cooling system according to an embodiment.

With reference to FIG. 6, hybrid adiabatic cooling system 100 may include a controller 600 in electrical communication, such as through power line communication or BACnet communication PLC or other analog or digital control system, with first valve 126, second valve 128, hybrid adiabatic cooler 130, direct liquid cooling unit 140, air handling unit 150, chiller 160, primary pump 190, and/or secondary pump 192. For example, controller 600 may include an output interface configured to transmit control signals to first valve 126, second valve 128, hybrid adiabatic cooler 130, primary pump 190, and secondary pump 192 such that controller 600 is configured to actuate first valve 126, second valve 128, hybrid adiabatic cooler 130, primary pump 190, and secondary pump 192. In some embodiments, controller 600 may be incorporated as a module of a controller in the data center's building automation system.

In some embodiments, controller 600 may include an input interface to receive input signals from one or more sensors and/or data sources to monitor the conditions (e.g., dry-bulb temperature) of outdoor ambient air, indoor air of data center 10, and/or the first cooling liquid. For example, hybrid adiabatic cooling system 100 may include an outdoor temperature sensor 610 disposed outside of data center 10, such as being proximate to hybrid adiabatic cooler 130. Outdoor temperature sensor 610 (e.g., a thermocouple, thermometer, thermistor) may detect the temperature of outdoor ambient air being drawn into hybrid adiabatic cooler 130 and generate an input signal to controller 600 indicating the temperature of outdoor ambient air being drawn into hybrid adiabatic cooler 130.

Hybrid adiabatic cooling system 100 may include an indoor temperature sensor 620 disposed in the data center 10, for example, being proximate to air handling unit 150. Indoor temperature sensor 620 (e.g., a thermocouple, thermometer, thermistor) may detect the temperature of indoor ambient air being drawn into air handling unit 150 and generate an input signal to controller 600 indicating the temperature of indoor ambient air being drawn into air handling unit 150.

Hybrid adiabatic cooling system 100 may include one or more cooling liquid sensors 630 disposed in outer conduit loop 110, such as in feed segment 112, and/or in inner conduit loop 120, such as in first segment 122. Cooling liquid sensor 630 (e.g., a thermocouple, thermometer, thermistor) may detect the temperature of the first cooling liquid circulating through feed segment 112 of outer conduit loop 110 and/or the temperature of the first cooling liquid circulating through first segment 122 of inner conduit loop 120.

Cooling liquid sensor 630 may generate an input signal to controller 600 indicating the temperature of the first cooling liquid circulating through feed segment 112 of outer conduit loop 110 and/or the temperature of the first cooling liquid circulating first segment 122 of inner conduit loop 120.

Hybrid adiabatic cooling system 100 may include one or more additional data sources 640, such as receiving input from a network (e.g., local area network, wide area network). For example, data source 640 may indicate weather forecasts that can be processed to determine a predicted outdoor ambient temperature and humidity.

In some embodiments, controller 600 may include a processor (e.g., a microprocessor, a multi-core processor, a central processing unit) configured to receive input signals from outdoor temperature sensor 610, indoor temperature sensor 620, cooling liquid sensor 630, and data source 640 and generate actuation signals transmitted to first valve 126, second valve 128, hybrid adiabatic cooler 130, primary pump 190, and secondary pump 192 to control the flow and temperature of the first cooling liquid through outer conduit loop 110 and inner conduit loop 120. Controller 600 may include memory comprising computer storage media in the form of volatile memory, such as RAM, and/or nonvolatile memory, such as ROM. In some embodiments, the memory of controller 600 may store computer readable instructions, data structures, program modules, and other data, which are inputted to the processor for the execution of operations, as described herein. Controller 600 can include any type of circuitry components, such as a bus, for transmitting instructions stored in the memory to the processor.

In operation, controller 600 is configured to selectively actuate first valve 126, second valve 128, hybrid adiabatic cooler 130, direct liquid cooling unit 140, air handling unit 150, chiller 160, primary pump 190, and/or secondary pump 192 based on input from outdoor temperature sensor 610, indoor temperature sensor 620, cooling liquid sensor 630, and data source 640 according to a predetermined protocol that includes a plurality of operation modes. The plurality of operation modes can include, for example, a free cooling mode, a dry chiller mode, and a wet chiller mode.

Free Cooling Mode (e.g., Low Ambient Outdoor less than 65° F., 18.3° C.)

When hybrid adiabatic cooling system 100 is operating in the free cooling mode, first valve 126 and second valve 128 are each set in the first position and secondary pump 192 remains in an off state, such that first cooling liquid diverted from feed segment 112 of outer conduit loop 110 to inner conduit loop 120 bypasses chiller 160. Hybrid adiabatic cooler 130 operates in dry mode during free cooling mode, thereby not moisturizing outdoor ambient air drawn through hybrid adiabatic cooler 130.

Hybrid adiabatic cooling system 100 is configured to operate in the free cooling mode when the outdoor ambient air temperature is lower than a first threshold temperature, for example in a range from 55° F. to 75° F. (12.8° C. to 23.9° C.), such as 65° F. (18.3° C.). When the outer door ambient temperature is below the first temperature threshold, hybrid adiabatic cooler 130 is configured to cool the heated first cooling liquid circulated received return segment 114 to a desired operating temperature (e.g., 22.8° C., 73.0° F.) sufficient for allowing direct liquid cooling unit 140 and room air handling unit 150 to dissipate their target heat loads in the data center 10 without using chiller 160 or any refrigeration to cool the first cooling liquid (e.g., water). The first threshold temperature and/or desired operating temperature may vary based on the heat load of the data center 10 and heat dissipation capacity of the hybrid adiabatic cooler 130, direct liquid cooling unit 140, and air handling unit 150.

When receiving the first cooling liquid at the desired operating temperature, air handling unit 150 emits conditioned indoor air at a predetermined temperature (e.g., 26.7° C., 80.0° F.) to convectively air cool electric components 20 of data center 10. In doing so, air handling unit 150 maintains a lower temperature differential A (e.g., 3.9° C., 7.0° F.) between the temperature of first cooling liquid (e.g., water) entering inlet 152 and the temperature of the emitted condition air compared to temperature differentials A (e.g., 5.5° C., 10.0° F.) maintained in traditional, prior art computer room air handling units. By maintaining this decreased temperature differential Δ between the first cooling liquid and conditioned air, the hybrid adiabatic cooler 130 increases the hours per year of the cooling system 100 operating in free cooling mode (cooling without the use of mechanical refrigeration), thereby decreasing the pump energy demand by approximately 50% and other costs, including the reduction or elimination of pipe insulation.

Dry Chiller Mode (e.g., Ambient Outdoor equal to or greater than 65° F., 18.3° C.)

When hybrid adiabatic cooling system 100 is operating in the dry chiller mode, first valve 126 and second valve 128 are each set in the second position and secondary pump 192 is activated to an operational state, such that first cooling liquid diverted from feed segment 112 of outer conduit loop 110 to inner conduit loop 120 is circulated through chiller 160 to further cool the diverted portion of first cooling liquid before supplied to air handling unit 150. Hybrid adiabatic cooler 130 operates in dry mode during dry chiller mode, thereby not moisturizing outdoor ambient air drawn through hybrid adiabatic cooler 130.

Hybrid adiabatic cooling system 100 is configured to operate in the dry chiller mode when the outdoor ambient temperature is equal to above the first threshold temperature (e.g., 18.3° C., 65.0° F.) and below a second threshold temperature for example in a range from 70° F. to 95° F. (12.8° C. to 23.9° C.), such as 82° F. (27.9° C.). When the outer door ambient temperature is above the first temperature threshold, hybrid adiabatic cooler 130 is not configured to cool the heated first cooling liquid received from return segment 114 of outer conduit loop 110 to the desired operating temperature (e.g., 22.8° C., 73.0° F.), and the first cooling liquid supply temperature floats up in response to a rise in outdoor ambient conditions.

As the temperature of the first cooling liquid (e.g., water) rises above the desired operating temperature (e.g., 22.8° C., 73.0° F.), controller 600 of hybrid adiabatic cooling system 100 responds to maintain the first cooling liquid temperature delivered to inner conduit loop 120 by actuating secondary pump 192 in series with the working fluid cooled evaporator section 163 of chiller 160 cooled by a working fluid (e.g., water or refrigerant), thereby lowering first cooling liquid temperature in inner conduit loop 120 to the desired operating temperature (e.g., 22.8° C., 73.0° F.). In some embodiments, during dry chiller mode, the first cooling liquid is discharged from air handling unit 150 at a nominal temperature (e.g., 33.9° C., 93.0° F.), then passes through condenser section 166 of chiller 160, thereby heating the first cooling liquid to a nominal temperature (e.g., 44.4° C., 112.0° F.) before merging with the first cooling liquid circulating through return segment 114 of outer conduit loop 110.

Wet Chiller Mode (e.g., Ambient Outdoor Equal to or Greater than 82° F., 27.9° C.)

When hybrid adiabatic cooling system 100 is operating in the wet chiller mode, first valve 126 and second valve 128 are each set in the second position and secondary pump 192 is activated to an operational state, such that first cooling liquid diverted from feed segment 112 of outer conduit loop 110 to inner conduit loop 120 is circulated through chiller 160 to further cool the diverted portion of first cooling liquid before supplied to air handling unit 150. Furthermore, hybrid adiabatic cooler 130 operates in the wet mode during wet chiller mode, thereby moisturizing outdoor ambient air drawn through hybrid adiabatic cooler 130.

Hybrid adiabatic cooling system 100 is configured to operate in the wet chiller mode when the outdoor ambient temperature is equal to above the second threshold temperature (e.g., 27.8° C., 82.0° F.). When the outer door ambient temperature is equal to the second temperature threshold, hybrid adiabatic cooler 130 is configured to supply the first cooling liquid through feed segment 112 of outer conduit loop 110 at a maximum operating temperature (e.g., 32.2° C., 90.0° F.) adequate for allowing the direct liquid cooling unit 140 to dissipate its target heat load in data center 10. The maximum operating temperature may vary based on the heat load of data center 10 and the heat dissipating capacity of adiabatic cooler 130 and/or direct liquid cooling unit 140.

However, when the outer door ambient temperature is above the second temperature threshold, hybrid adiabatic cooler 130 is not configured to supply the first cooling liquid through feed segment 112 of outer conduit loop 110 at a maximum operating temperature (e.g., 32.2° C., 90.0° F.) such that the first cooling liquid temperature potentially rises above the maximum operating temperature. In response, controller 600 of hybrid adiabatic cooling system 100 actuates hybrid adiabatic cooler 130 to operate in the wet mode (e.g., adiabatic pad 250 moisturizes air intake) to pre-cool the outdoor ambient air drawn through hybrid adiabatic cooler 130, thereby increasing the heat dissipation rate of the first cooling liquid circulating through hybrid adiabatic cooler 130. By operating in the wet mode, hybrid adiabatic cooler 130 maintains the first cooling liquid circulating through feed segment 112 at the maximum operating temperature (e.g., 32.2° C., 90.0° F.). In some embodiments, the first cooling liquid discharged from direct liquid cooling unit 140 into return segment 114 is combined with the diverted portion of the first cooling liquid circulating through inner conduit loop 120, each set at a nominal temperature (e.g., 44.4° C., 112.0° F.).

Method of Operation

Figure 7:
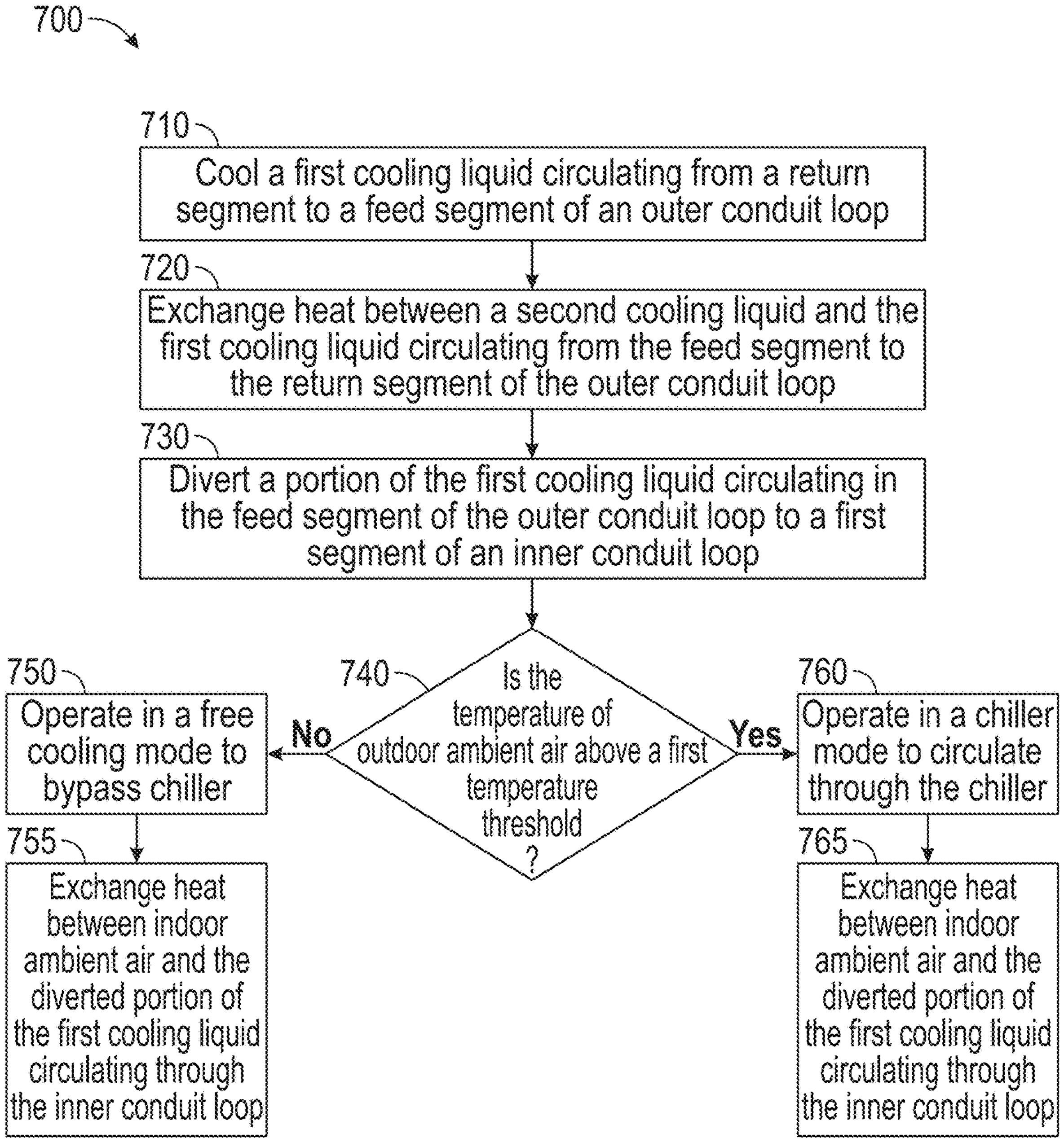
FIG. 7 illustrates a block diagram showing aspects of a method of controlling a hybrid adiabatic cooling system to cool an interior of a data center according to an embodiment.

FIG. 7 illustrates an example method 700 of controlling hybrid adiabatic cooling system 100 to cool the interior of data center 10.

In some embodiments, method 700 may include a step 710 of cooling the first cooling liquid (e.g., water) circulating from return segment 114 of outer conduit loop 110 to feed segment 112 of outer conduit loop 110. Step 710 may include using hybrid adiabatic cooler 130 to cool the first cooling liquid. For example, step 710 may include activating the hybrid adiabatic cooler's blower to draw ambient air through air inlet 210 and circulating the first cooling liquid (e.g., water) through heat exchanger 240, thereby cooling the first cooling liquid. Step 710 may include actuating primary pump 190 to propel the first cooling liquid through outer conduit loop 110. Step 710 may include setting first valve 126 and second valve 128 in the first position and setting chiller 160 in an off state. Step 710 may result in cooling the first cooling liquid in a temperature range from a desired operating temperature (e.g., 22.8° C., 73.0° F.) to a maximum operating temperature (e.g., 32.2° C., 90.0° F.).

In some embodiments, method 700 may include a step 720 of exchanging heat between the second cooling liquid (e.g., coolant) and the first cooling liquid (e.g., water) circulating from feed segment 112 of the outer conduit loop 110 to return segment 114 of outer conduit loop 110. Step 720 may include using direct liquid cooling unit 140 to exchange heat between the first cooling liquid and the second cooling liquid. Step 720 may include using cold plates cooled by the second cooling liquid of the direct liquid cooling unit 140 to dissipate heat from electric components 20 of data center 10. Step 720 may include immersing electric components 20 with a dielectric coolant, used as the second cooling liquid in direct liquid cooling unit 140, to dissipate heat from electric components 20 of data center 10. Step 720 may result in heating the first cooling liquid to a nominal temperature (e.g., 44.4° C., 112.0° F.).

In some embodiments, method 700 may include a step 730 of diverting a portion of the first cooling liquid circulating in feed segment 112 of the outer conduit loop 110 to first segment 122 of inner conduit loop 120. Step 730 may include diverting the first cooling liquid to feed line 171 of first segment 122 of inner conduit loop 120.

In some embodiments, method 700 may include a step 740 of determining to operate the hybrid adiabatic cooling system 100 in a free cooling mode or a chiller mode (e.g., dry chiller mode or wet chiller mode) based on a temperature of outdoor ambient air drawn through hybrid adiabatic cooler 130 to cool the first cooling liquid. Step 740 may including using controller 600 to determine the mode of operation for hybrid adiabatic cooling system 100. For example, step 740 may include using controller 600 to determine whether the outdoor ambient air temperature is above the first threshold temperature (65° F.). Step 740 may include receiving an input signal from outdoor temperature sensor 610 to determine the outdoor ambient air temperature. Step 740 may include using an algorithm stored in the memory of controller 600 to determine the mode of operation based on the current outdoor ambient air temperature, other weather conditions (e.g., humidity, forecasted temperature), temperature of the first cooling liquid, and/or heat load of data center as inputs.

In some embodiments, method 700 may include a step 750 of operating hybrid adiabatic cooling system 100 in a free cooling mode such that the diverted portion first cooling liquid circulating through inner conduit loop 120 bypasses chiller 160. Step 750 may include setting or maintaining first valve 126 and second valve 128 in the first position. Step 750 may include setting or maintaining secondary pump 192 and chiller 160 in an off state. Step 750 may including using controller 600 to control positioning of first valve 126 and second valve 128 and operation state of chiller 160 and secondary pump 192. Step 750 may result in the first cooling liquid circulating from feed line 171 to bypass feed line 174 of first segment 122 of inner conduit loop 120.

In some embodiments, while operating hybrid adiabatic cooling system 100 in the free cooling mode, method 700 may include a step 755 of exchanging heat between indoor ambient air and the diverted portion of the first cooling liquid circulating from first segment 122 to second segment 124 of inner conduit loop 120. Step 765 may include using the air handling unit 150 to exchange between indoor ambient air and the diverted portion of the first cooling liquid.

In some embodiments, method 700 may include a step 760 of operating hybrid adiabatic cooling system 100 in a chiller mode such that diverted portion of first cooling liquid circulates through chiller 160. Step 760 may include setting first valve 126 and second valve 128 in the second position. Step 760 may include actuating secondary pump 192 and chiller 160. Step 760 may including using controller 600 to control positioning of first valve 126 and second valve 128 and operation state of chiller 160 and secondary pump 192. Step 750 may result in the first cooling liquid circulating from feed line 171 to first chiller inlet line 172 and then through evaporator section 163 of chiller 160 before being delivered to air handling unit 150.

In some embodiments, while operating hybrid adiabatic cooling system 100 in the chiller mode (dry or wet chiller mode), method 700 may include a step 765 of exchanging heat between indoor ambient air and the diverted portion of the first cooling liquid circulating from first segment 122 to second segment 124 of inner conduit loop 120. Step 765 may include using the air handling unit 150 to exchange between indoor ambient air and the diverted portion of the first cooling liquid.

In some embodiments, method 700 may include additional steps, such as a step of determining to operate the hybrid adiabatic cooling system 100 in a dry chiller mode or a wet chiller mode based on a temperature of outdoor ambient air drawn through hybrid adiabatic cooler 130. For example, the step may include using controller 600 to determine whether the outdoor ambient air temperature is above the second temperature threshold (82° F.) and operate in the wet chiller mode when the outdoor ambient air temperature is above the second temperature threshold.

All temperatures and fluid flow rates described herein are approximate and illustrative of one or more embodiments according to the present disclosure.

It is to be appreciated that the Detailed Description section, and not the Summary and Abstract sections, is intended to be used to interpret the claims. The Summary and Abstract sections may set forth one or more but not all exemplary embodiments of the present embodiments as contemplated by the inventor(s), and thus, are not intended to limit the present embodiments and the appended claims in any way.

The present disclosure has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the embodiments that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

What is claimed is:

1. A method of controlling a hybrid adiabatic cooling system to cool an interior of a data center, comprising:

cooling, by a hybrid adiabatic cooler, a first cooling liquid circulating from a return segment of a first conduit loop to a feed segment of the first conduit loop;

exchanging, by a direct liquid cooling unit, heat between a second cooling liquid and a first portion of the first cooling liquid circulating from the feed segment of the first conduit loop to the return segment of the first conduit loop;

diverting a second portion of the first cooling liquid from the first portion of the first cooling liquid circulating in the feed segment of the first conduit loop to a first segment of a second conduit loop;

determining, by a controller, whether to operate the hybrid adiabatic cooling system in a free cooling mode or a chiller mode based on a temperature of outdoor ambient air drawn through the hybrid adiabatic cooler to cool the first cooling liquid; and exchanging, by a room air handling unit, heat between indoor ambient air and the diverted second portion of the first cooling liquid circulating from the first segment of the second conduit loop to a second segment of the second conduit loop that is fluidly coupled to the return segment of the first conduit loop, wherein the room air handling unit and the direct liquid cooling unit are located at different locations inside of the data center, wherein the diverted second portion of the first cooling liquid in the first segment of the second conduit loop bypasses a chiller when the controller operates the hybrid adiabatic cooling system in the free cooling mode, wherein the diverted second portion of the first cooling liquid in the first segment of the second conduit loop circulates through the chiller when the controller operates the hybrid adiabatic cooling system in the chiller mode.

2. The method of claim 1, wherein the controller operates the hybrid adiabatic cooling system in the free cooling mode when the temperature of the outdoor ambient air is less than a first threshold temperature and in the chiller mode when the temperature of the outdoor ambient air is above the first threshold temperature.

3. The method of claim 1, further comprising:

deactivating a pump fluidly coupled to the second conduit loop when the controller operates the hybrid adiabatic cooling system in the free cooling mode; and activating the pump fluidly coupled to the second conduit loop to propel the first cooling liquid to the chiller when the controller operates the hybrid adiabatic cooling system in the chiller mode.

4. The method of claim 2, further comprising:

determining, by the controller, whether to operate the hybrid adiabatic cooling system in a dry mode or a wet mode based on the temperature of the outdoor ambient air drawn through the hybrid adiabatic cooler to cool the first cooling liquid, wherein the hybrid adiabatic cooler does not moisturize the outdoor ambient air drawn through the hybrid adiabatic cooler when the controller operates the hybrid adiabatic cooling system in the dry mode, and wherein the hybrid adiabatic cooler moisturizes the outdoor ambient air drawn through the hybrid adiabatic cooler when the controller operates the hybrid adiabatic cooling system in the wet mode.

5. The method of claim 4, wherein the controller operates the hybrid adiabatic cooling system in the dry mode when the temperature of the outdoor ambient air is less than a second threshold temperature and in the wet mode when the temperature of the outdoor ambient air is above the second threshold temperature.

6. The method of claim 5, wherein the second threshold temperature is greater than the first threshold temperature.

7. The method of claim 1, wherein the first segment of the second conduit loop includes:

a feed line fluidly coupled to the feed segment of the first conduit loop;

a first chiller inlet line fluidly coupled to the feed line and a first inlet of the chiller;

a chiller outlet line fluidly coupled to a first outlet of the chiller and an inlet of the room air handling unit;

a bypass feed line fluidly coupled to the feed line and the chiller outlet line; and a first valve fluidly coupled to the feed line, the first chiller inlet line, and the bypass feed line of the first segment of the second conduit loop.

8. The method of claim 7, further comprising:

setting the first valve to a first position to direct the diverted second portion of the first cooling liquid from the feed line to the bypass feed line when the controller operates the hybrid adiabatic cooling system in the free cooling mode; and setting the first valve to a second position to direct the diverted second portion of the first cooling liquid from the feed line to the first chiller inlet line when the controller operates the hybrid adiabatic cooling system in the chiller mode.

9. The method of claim 8, wherein the second segment of the second conduit loop includes:

a discharge line fluidly coupled to an outlet of the room air handling unit;

a second chiller inlet line fluidly coupled to the discharge line and a second inlet of the chiller;

a second chiller outlet line fluidly coupled to a second outlet of the chiller and the return segment of the first conduit loop;

a bypass outlet line fluidly coupled to the discharge line and the return segment of the first conduit loop; and a second valve fluidly coupled to the discharge line, the second chiller inlet line, and the bypass outlet line of the second segment of the second conduit loop, wherein the second valve is configured to switch between a first position and a second position.

10. The method of claim 9, further comprising:

setting the second valve to a first position to direct the diverted second portion of the first cooling liquid from the discharge line to the bypass outlet line when the controller operates the hybrid adiabatic cooling system in the free cooling mode; and setting the second valve to a second position to direct the diverted second portion of the first cooling liquid from the discharge line to the second chiller inlet line when the controller operates the hybrid adiabatic cooling system in the chiller mode.

11. The method of claim 1, wherein the hybrid adiabatic cooler is disposed outside of the data center.

12. The method of claim 1, wherein the feed segment of the first conduit loop directs the first cooling liquid from outside of the data center to the interior of the data center, and the return segment of the first conduit loop directs the first cooling liquid from the interior of the data center to the outside of the data center.

13. The method of claim 1, wherein the first cooling liquid is water, and the second cooling liquid is a dielectric coolant.

* * * * *